(12) United States Patent
Chu

(10) Patent No.: US 10,613,572 B1
(45) Date of Patent: Apr. 7, 2020

(54) SYSTEMS FOR GENERATING PROCESS, VOLTAGE, TEMPERATURE (PVT)-INDEPENDENT CURRENT FOR A LOW VOLTAGE DOMAIN

(71) Applicant: Micron Technology, Inc., Boise, ID (US)

(72) Inventor: Wei Lu Chu, Xuhui District (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/387,146

(22) Filed: Apr. 17, 2019

(51) Int. Cl.
*G05F 3/26* (2006.01)
*G05F 1/46* (2006.01)
*H03F 3/50* (2006.01)

(52) U.S. Cl.
CPC .............. *G05F 3/262* (2013.01); *G05F 1/468* (2013.01); *H03F 3/50* (2013.01)

(58) Field of Classification Search
CPC ... G05F 3/20; G05F 3/205; G05F 3/22; G05F 3/222; G05F 3/225; G05F 3/227; G05F 3/26; G05F 3/262
USPC ........................... 323/313–317; 327/538–541
See application file for complete search history.

(56) References Cited

U.S. PATENT DOCUMENTS

| | | | |
|---|---|---|---|
| 6,087,820 A * | 7/2000 | Houghton | G05F 3/262 323/315 |
| 2008/0061864 A1* | 3/2008 | Oberhuber | G05F 3/30 327/512 |

OTHER PUBLICATIONS

U.S. Appl. No. 16/203,320, filed Nov. 28, 2018, Wei Lu Chu.
U.S. Appl. No. 16/384,433, filed Apr. 15, 2019, Wei Lu Chu.

* cited by examiner

*Primary Examiner* — Nguyen Tran
(74) *Attorney, Agent, or Firm* — Fletcher Yoder, P.C.

(57) ABSTRACT

Systems and devices are provided for generating a process, voltage, temperature (PVT)-independent reference current for a relatively low voltage domain. An apparatus may include a bandgap circuit that outputs a bandgap voltage and a first proportion-to-absolute temperature (PTAT) current. The apparatus may also include trimming circuitry that outputs a reference a voltage based at least in part on the bandgap voltage. Further, the apparatus may include reference current generation circuitry. In particular, the reference current generation circuitry may include a complementary-to-absolute-temperature (CTAT) current generation portion that generates a CTAT current based on the reference voltage as well as a PTAT current tuning portion that tunes a received first PTAT current to generate a second PTAT current. In addition, the CTAT current generation portion may include a variation-independent reference current generation portion that generates a reference current based on the CTAT current and the second PTAT current.

21 Claims, 4 Drawing Sheets

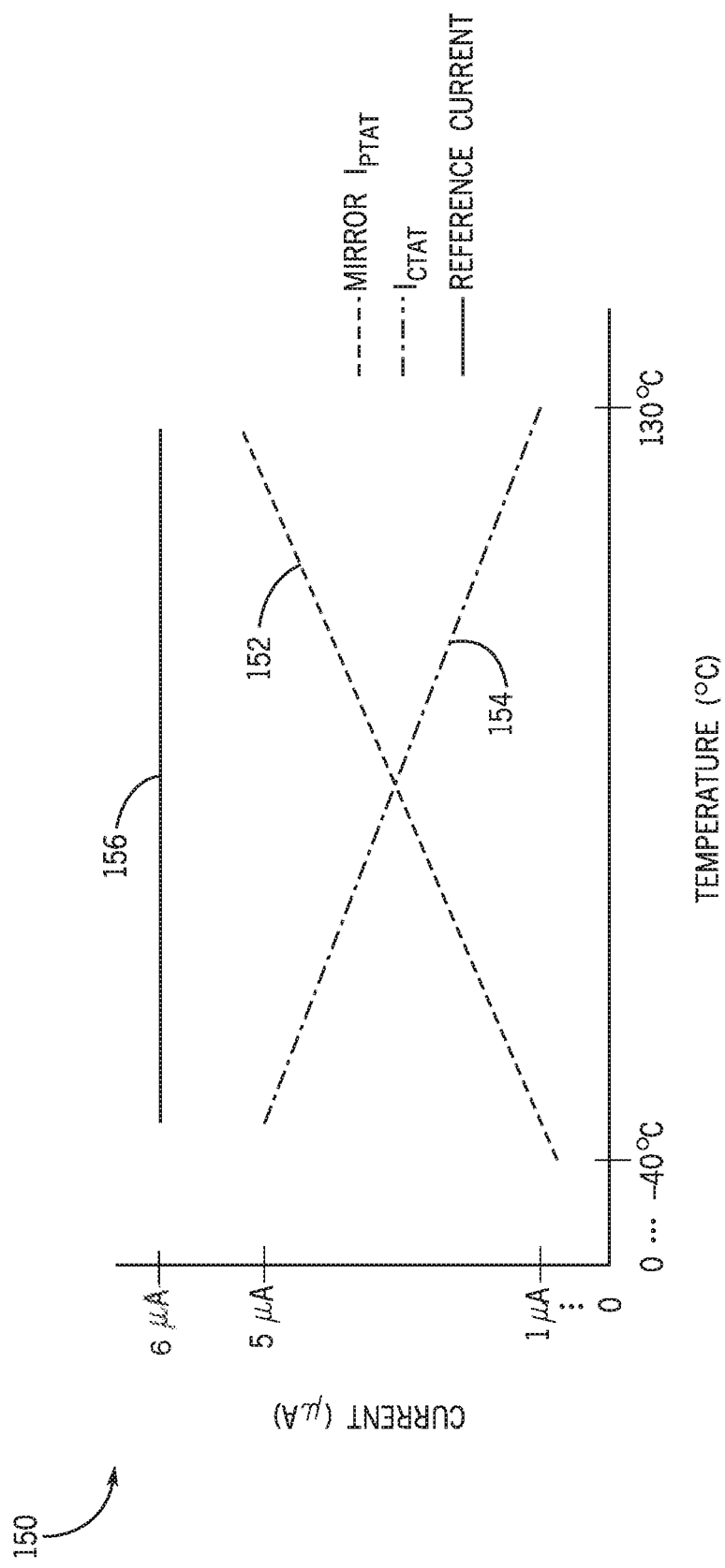

US 10,613,572 B1

SYSTEMS FOR GENERATING PROCESS, VOLTAGE, TEMPERATURE (PVT)-INDEPENDENT CURRENT FOR A LOW VOLTAGE DOMAIN

BACKGROUND

The present disclosure relates generally to the field of bandgap circuits and, more particularly, to techniques for generating a process, voltage, temperature (PVT)-independent reference current of a low voltage domain using the bandgap circuit.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic devices, such as semiconductor devices, memory chips, microprocessor chips, image chips, and the like, may include circuitry that performs various operations based on a provided reference voltage. For example, the circuitry may be reference current generation circuitry that uses the reference voltage to generate a current supply to components (e.g., electrical loads) of the electronic device. The reference current generation circuitry however, may generate a reference current that deviates from a target current magnitude due to process (e.g., semiconductor fabrication, loading, and transistor operation variability), supply voltage, or operating temperature variations. These deviations may result in the electronic device functioning in an unintended manner.

Further, the reference current generation circuitry may consume resources, such as available device space and power. In certain electronic devices, the consumption of such resources by the reference current generation circuitry may be constrained by device specifications. Accordingly, embodiments of the present disclosure may be directed to systems and devices for generating a PVT-independent reference current of a relatively low voltage domain while reducing consumption of resources by the reference current generation circuitry.

BRIEF DESCRIPTION OF DRAWINGS

Various aspects of this disclosure may better be understood upon reading the following detailed description and upon reference to the drawings in which:

FIG. 4 is a graph of current behavior with regard to temperature variations, in accordance with an embodiment of the present disclosure.

DETAILED DESCRIPTION

Figure 1:
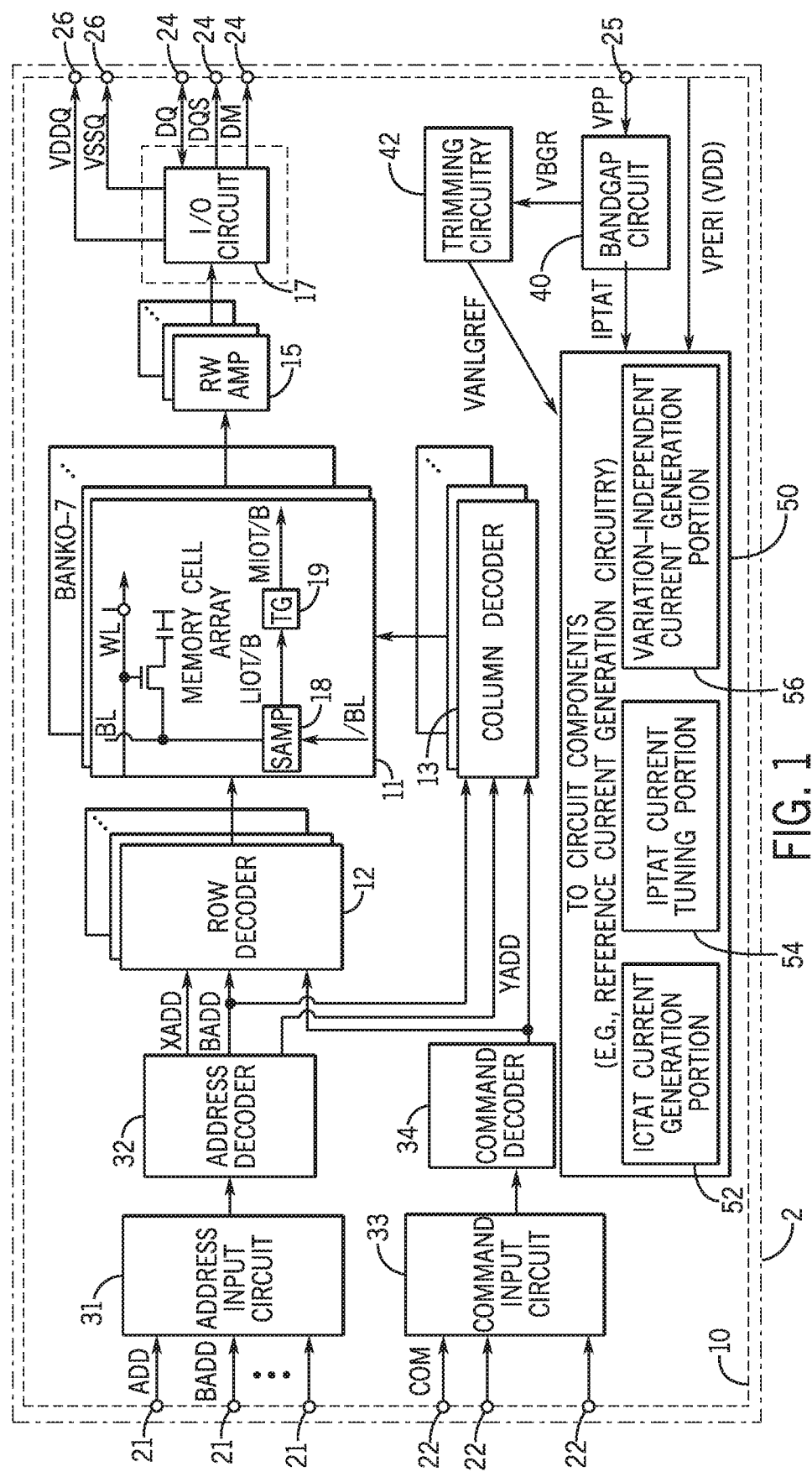
FIG. 1 is a simplified block diagram illustrating a semiconductor device that includes a bandgap circuit and reference current generation circuitry, in accordance with an embodiment of the present disclosure.

One or more specific embodiments will be described below. To provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure generally relates to electronic devices that employ a bandgap circuit and reference current generation circuitry to generate a constant reference current of a relatively low voltage domain. Generally, certain operations of electronic devices may rely on a reference current. For example, a reference current may be used as a biasing source for oscillators and/or amplifiers of the electronic device, as a power source for phase-looked loops (PLL) of the electronic device, and the like. Circuitry, such as reference current generation circuitry, may be used to generate the reference current using a reference voltage.

The reference voltage, in particular, may be based on a bandgap voltage ($V_{bgr}$) generated by the bandgap circuit. The bandgap voltage ($V_{bgr}$) may be designed to be at a constant (e.g., stable) voltage level regardless of various circuit loads, power supply variations, temperature changes, and the like (PVT conditions). However, during tape-out (e.g., result of a design process before a chip design is sent for manufacturing) of the bandgap circuit, the bandgap voltage ($V_{bgr}$) level may vary from the designed voltage level. For example, the bandgap voltage ($V_{bgr}$) may be designed at 1.2 volts, but after tape-out, the $V_{bgr}$ voltage level may vary between 1.17 volts and 1.23 volts due to variations in silicon fabrication. Because the reference current may be based on the bandgap voltage ($V_{bgr}$), variations in the bandgap voltage ($V_{bgr}$) level may reduce the stability of the generated reference current.

Thus, in some cases, each die (e.g., a portion of a silicon wafer including a fully functional chip) that includes a bandgap circuit may also include trimming circuitry that trims (e.g., adjusts) the bandgap voltage ($V_{bgr}$) after tape-out to produce an analog reference voltage (e.g., $V_{AnlgRef}$) of a known value that does not deviate after tape-out. For example, a resistor stack coupled to the bandgap circuit may trim the bandgap voltage ($V_{bgr}$) to produce an analog reference voltage ($V_{AnlgRef}$) at a voltage level of 0.8 volts. Such a reference voltage may be very accurate, reliable, and reproducible regardless of variations in the PVT conditions.

Further, electronic device specifications may restrict power consumption by the reference current generation circuitry and/or other components of the electronic device. In particular, when the reference current generation circuitry includes resource-consuming elements (e.g., large resistors)

and/or relatively high-power voltage sources (e.g., drain-to-drain power supply potential (VDD)) to generate the reference current, the reference current generation circuitry may consume too much power. In addition, when the relatively high-power voltage sources voltage source is used to drive (e.g., power) the reference current generation circuitry, the reference current generated by the reference current generation circuitry may be of a high voltage domain, rendering it unusable by other components of the electronic device designed to operate in a low voltage domain to reduce power consumption. As an example, the reference current generation circuitry may operate in a relatively high voltage domain (e.g., VDD domain), while the other components may operate in a relatively low voltage domain (e.g., peripheral voltage (VPERI) domain). In such situations, the generated reference current of the VDD domain may be of too high voltage value to be appropriately handled by the other components.

In addition, components of the bandgap circuit and the reference current generation circuitry may exhibit varying electrical behavior as temperature varies. For example, the bandgap circuit may also output a proportional-to-absolute-temperature current ($I_{PTAT}$) and the reference current generation circuitry may generate a complementary-to-absolute temperature currents ($I_{CTAT}$). Briefly, certain circuit elements may see a change in resistance value as an environmental temperature varies. Certain circuit elements, such as diodes, metal-oxide field effect transistors (MOSFETs), and the like, may be composed of active materials with resistances that change inversely with respect to temperature. The bandgap circuit may use the relationship between resistance and temperature by applying the bandgap voltage ($V_{bgr}$) across such circuit elements as the temperature varies, generating the $I_{PTAT}$ whose magnitude also varies in proportion to changes in temperature, but otherwise has a predictable value that is independent of variations in process and voltage conditions, as will be discussed in more detail below.

Additionally, certain other circuit elements, such as resistors, may see an increase in resistivity as the temperature increases. When a voltage is applied across the resistor of, for example, the reference current generation circuitry, the increase in resistance as the temperature increases may result in the $I_{CTAT}$ whose magnitude decreases as the temperature increases. The resulting $I_{CTAT}$ may have a predictable value that varies with temperature, but is independent of variations in process and voltage conditions. However, because of the temperature dependencies of the $I_{PTAT}$ and $I_{CTAT}$, neither current may alone provide the reference current that is independent of PVT condition variations.

Accordingly, the present disclosure provides systems and techniques for generating a PVT-independent reference current of a relatively low voltage domain in a resource-efficient manner via reference current generation circuitry. The reference current generation circuitry may reuse outputs of the bandgap circuit to generate a portion of the reference current without use of resource-consuming elements (e.g., large resistor), may use a relatively low potential, internally generated voltage signal to generate another portion of the reference current to improve power savings, and may combine the portions of the reference current to generate the reference current. In particular, the reference current circuitry may include a complementary-to-absolute-temperature current ($I_{CTAT}$) generation portion, a proportional-to-absolute-temperature current ($I_{PTAT}$) tuning portion, and a variation-independent current generation portion.

In some embodiments, the $I_{CTAT}$ generation portion may generate the $I_{CTAT}$ by applying the trimmed bandgap voltage (e.g., the analog reference voltage ($V_{AnlgRef}$)) to a CTAT resistor of the $I_{CTAT}$ generation portion. The application of the analog reference voltage ($V_{AnlgRef}$) across the resistor may be driven by an operational amplifier that is in a voltage follower configuration. Further, in some embodiments, the $I_{PTAT}$ tuning portion may receive the $I_{PTAT}$ from the bandgap circuit and may include one or more transistor branches (e.g., fingers) that trim the received $I_{PTAT}$ to have a nearly or exactly complimentary behavior as that of the $I_{CTAT}$. In particular, the one or more transistor branches may be optioned out depending on the behavior of the $I_{CTAT}$ magnitude in relation to the temperature.

Additionally or alternatively, in some embodiments, the variation-independent current generation portion may be coupled to the $I_{CTAT}$ generation portion and the $I_{PTAT}$ tuning portion. Because the $I_{CTAT}$ and $I_{PTAT}$ may be tuned to have inverse behaviors relative to each other as the temperature varies, the variation-independent current generation portion may sum the two currents to cancel out the temperature variation and generate the stable reference current that is independent of PVT variations. The reference current may be of a relatively low voltage domain as the $I_{CTAT}$ generation portion, the $I_{PTAT}$ tuning portion, and the variation-independent current generation portion may be driven using an internally generated potential operating at a relative low voltage domain (e.g., VPERI). Additional details with regard to generating the PVT-independent reference current of a relatively low voltage domain will be described below with reference to FIGS. 1-4.

With this in mind, FIG. 1 illustrates a semiconductor device 10 that includes a bandgap circuit and reference current circuitry, in accordance with an embodiment of the present disclosure. Although the following description of the semiconductor device 10 will be described in the context of a memory device, it should be noted that the embodiments described herein may be employed for any suitable electronic device. Indeed, the description of the memory device below is provided to explain certain aspects of the bandgap circuit and the reference current circuitry of the present disclosure, and, as such, the embodiments described herein should not be limited to memory devices.

The semiconductor device 10 may be any suitable memory device, such as a low power double data rate type 4 (LPDDR4) synchronous dynamic random-access memory (SDRAM) integrated onto a single semiconductor chip, a low power double data rate type 5 (LPDDR5), or a high bandwidth memory (HBM) device. The semiconductor device 10 may be mounted on an external substrate 2, such as a memory module substrate, a motherboard, and the like. The semiconductor device 10 may include a plurality of memory banks each having a plurality of memory cell arrays 11. Each memory cell array 11 may include a plurality of word lines WL, a plurality of bit lines BL, and a plurality of memory cells MC arranged at intersections of the plurality of word lines WL and the plurality of bit lines BL. The selection of the word line WL is performed by a row decoder 12 and the selection of the bit line BL is performed by a column decoder 13. Sense amplifiers (SAMP) 18 are coupled to corresponding bit lines BL and connected to local input/output (I/O) line pairs LIOT/B. Local IO line pairs LIOT/B are connected to main IO line pairs MIOT/B via transfer gates (TG) 19, which function as switches to control signal flow.

The semiconductor device 10 may also include a plurality of external terminals, which may communicate with other electrical components/devices. The external terminals may, in turn, include address terminals 21, command terminals 22, data terminals 24, and power supply terminals 25, 26. In particular, the address terminals 21 are supplied with an address signal ADD and a bank address signal BADD. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder 12 as well as a decoded column address signal YADD to the column decoder 13. The address decoder 32 also receives the bank address signal BADD and supplies the bank address signal BADD to the row decoder 12 and the column decoder 13.

The command terminals 22 are supplied with a command signal COM. The command signal COM may include one or more separate signals. The command signal COM input to the command terminals 22 is transferred to a command decoder 34 via the command input circuit 33. The command decoder 34 decodes the command signal COM to generate various internal command signals. For example, the internal commands may include a row command signal to select a word line WL and a column command signal, such as a read command or a write command, to select a bit line BL. Additionally, the data terminals 24 may be coupled to output buffers for read operations of memories or to input buffers for read/write access of the memories.

Although the address terminals 21 and the command terminals 22 are illustrated as separate terminals, it should be appreciated that in some embodiments, the address input circuit 31 and the command input circuit 33 may receive address signals ADD and command signals COM via the same terminal. For instance, the address and command terminals may provide an address signal at a falling clock edge (e.g., in synchronism with clock falling edge) and a command signal at a rising clock edge (e.g., in synchronism with clock rising edge). Further, the data terminals 24 may also be a single terminal that alternatively receives data signals (DQ, DQS, DM).

Accordingly, the address signals ADD, BADD and the command signals COM may be used to access a memory cell MC in the memory cell array 11. As an example, when a command signal COM indicating a read operation is timely supplied to a word line WL and a bit line BL designated by a respective row address and column address of the address signal ADD, data may be read from the memory cell MC associated with the row address and column address. The read data DQ may be output externally from the data terminals 24 via a read/write amplifier 15 and an input/output circuit 17. Similarly, when a command signal COM indicating a write operation is timely supplied to a word line WL and a bit line BL designated by a respective row address and column address of the address signal ADD, data DQ may be written to the memory cell MC associated with the row address and column address. The write data DQ may be supplied to the memory cell MC after being received from the data terminals 24, the input/output circuit 17, and the read/write amplifier 15.

In some embodiments, the input/output circuit 17 may include input buffers that store data for processing and/or transmission. Further, the input/output circuit 17 receives a timing signal from an external clock that controls input timing of read data DQ and output timing of write data DQ. The input/output circuit 17 may be powered using dedicated power supply potentials VDDQ and VSSQ, such that power supply noise generated by the input/output circuit 17 does not propagate to the other circuit blocks. The power supply potentials VDDQ and VSSQ may be of the same potentials as power supply potential VPERI/VDD that is internally generated within the semiconductor device 10 and supplied to power supply terminals 25 and to other circuit components, such as the reference current generation circuitry 50, respectively. In some embodiments, a voltage level of the power supply potential VPERI/VDD may be approximately 1.2-1.3 volts.

On the other hand, a bandgap circuit 40 of the semiconductor device 10 may be driven using a power supply potential VPP that is generated externally to the semiconductor device 10 and that is between a voltage level of 2.5-3.0 volts. In some embodiments, the bandgap circuit 40 may output a bandgap voltage ($V_{bgr}$) designed to be at a constant voltage level (e.g., 1.2 volts) independent of process variations (e.g., circuit loading), power supply variations, temperature changes, and the like (e.g., PVT conditions). However, after tape-out, the bandgap voltage ($V_{bgr}$) may no longer be output at the constant voltage level.

To provide a constant reference voltage for use by other circuit components of the semiconductor device 10, the bandgap voltage ($V_{bgr}$) may be transmitted to a trimming circuitry 42 that trims the bandgap voltage ($V_{bgr}$) to a stable voltage level. For example, the trimming circuitry 42 may include a configuration of resistors that may be adjusted to output a voltage ($V_{AnlgRef}$) at a constant voltage level, for example, of 0.8 volts based at least in part on the bandgap voltage ($V_{bgr}$). As such, the $V_{AnlgRef}$ may be independent of variations in the PVT conditions. Because of the PVT-independent nature of the $V_{AnlgRef}$, the $V_{AnlgRef}$ may be supplied to components of the semiconductor device 10 that generate an output based on a stable reference voltage.

As an example, the $V_{AnlgRef}$ may be supplied to the reference current generation circuitry 50 that also receives the $I_{PTAT}$ generated by the bandgap circuit 40. As will be discussed in more detail below, the reference current generation circuitry 50 may include an $I_{CTAT}$ generation portion 52, an $I_{PTAT}$ tuning portion 54, and a variation-independent current generation portion 56 that each utilize the $V_{AnlgRef}$ and/or the $I_{PTAT}$ current to generate a reference current independent of variations in the PVT conditions. In addition, the reference current generation circuitry 50 may use the power supply potential VPERI/VDD to generate the reference current as part of a relatively low voltage domain, for example, as compared to reference current generated using the power supply potential VPP. The generated reference current may be supplied to additional circuit components (e.g., amplifiers, oscillators, phase-locked loop (PLL)) of the semiconductor device 10.

Figure 2:
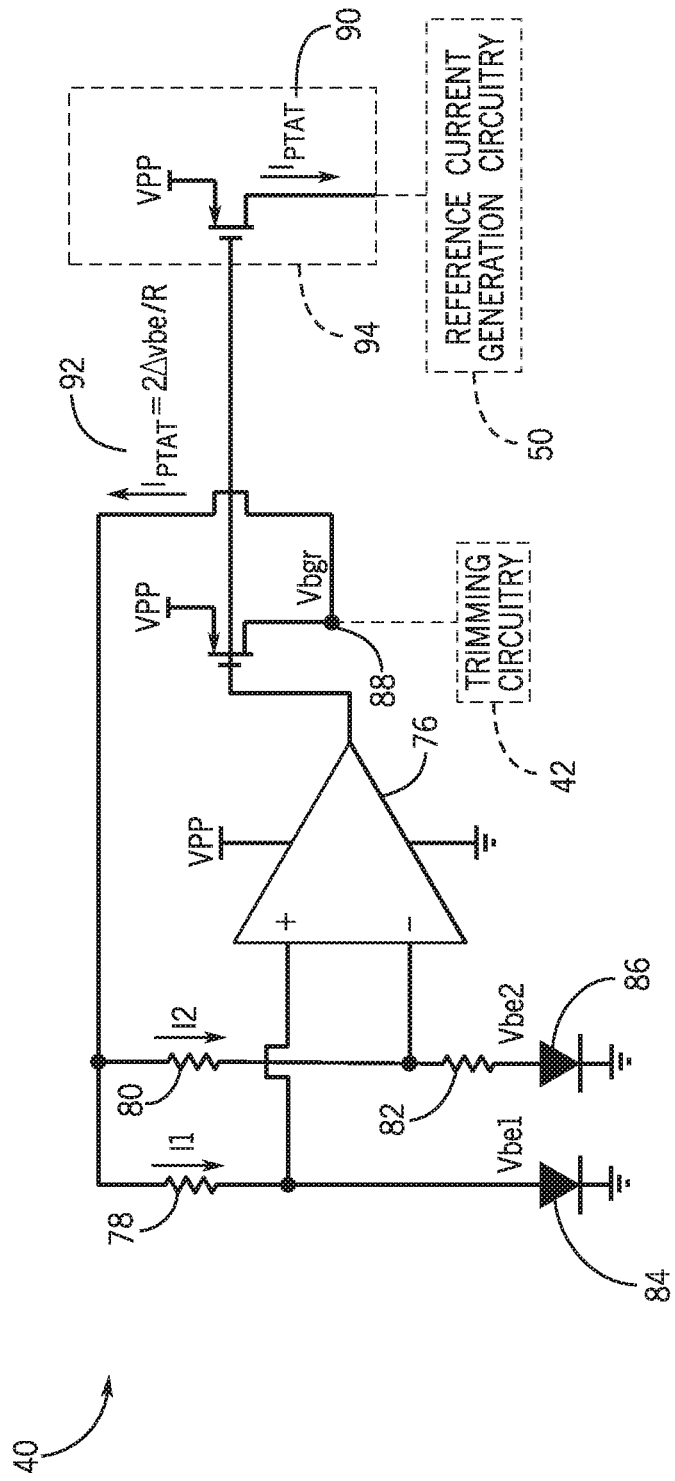
FIG. 2 is a schematic diagram of the bandgap circuit included in the semiconductor device of FIG. 1, in accordance with an embodiment of the present disclosure.

FIG. 2 illustrates a schematic diagram of the bandgap circuit 40 that may produce output signals $V_{bgr}$ and $I_{PTAT}$ to the trimming circuitry 42 and to the reference current generation circuitry 50, respectively, in accordance with an embodiment of the present disclosure. As shown, the bandgap circuit 40 may include a differential reference amplifier 76, one or more resistors 78, 80, 82 that may have the same or different resistances, and one or more diodes 84, 86.

Briefly, the bandgap circuit 40 may use a voltage difference across the diodes 84, 86 to generate the output signals $V_{bg}$ and $I_{PTAT}$. In particular, the diodes 84, 86 may be of different sizes (e.g., different current densities). Thus, the voltage drop $V_{be1}$ that appears across the diode 84 in response to current I1 flow may be different than the voltage drop $V_{be2}$ across the diode 86 in response to current I2 flow. Since the voltage behavior of the diodes 84, 86 is inversely dependent on temperature, the voltages $V_{be1}$ and $V_{be2}$ may be CTAT voltages that decrease in magnitude as the temperature increases.

The differential reference amplifier 76 may drive I1 to equal I2. Once equal, the voltage difference between $V_{be1}$ and $V_{be2}$ over the resistor 82 is a PTAT voltage over the resistor 82. That is, because the differential voltage ($\Delta V_{be} = V_{be1} - V_{be2}$) is proportional to temperature ($\Delta V_{be} \propto$ (kT)/Q), the differential voltage may increase as the temperature increases in a manner opposite to that of the CTAT voltage. The bandgap circuit 40 may then use the PTAT voltage and CTAT voltage to cancel the temperature variations of each voltage magnitude and thus, may output the bandgap voltage ($V_{bgr}$) 88 designed to not vary with PVT conditions. However, the bandgap voltage ($V_{bgr}$) 88 may not be output at an intended constant voltage level after tape-out. As such and as described above, the bandgap voltage ($V_{bgr}$) 88 may be transmitted to the trimming circuitry 42, which may trim the non-stable bandgap voltage ($V_{bgr}$) 88 to a stable level (e.g., 0.8 volts). In some embodiments, the stabilized bandgap voltage ($V_{bgr}$) 88 may be the $V_{AnlgRef}$, which may be used by the reference current generation circuitry 50 as a reference voltage that is independent of variations in the PVT conditions.

Further, the bandgap circuit 40 may generate an $I_{PTAT}$ 90 whose magnitude varies in proportion with temperature. In particular, an $I_{PTAT}$ 92 may be generated based at least in part on the bandgap voltage ($V_{bgr}$) 88 and may have twice the magnitude of the $I_{PTAT}$ 90. That is, the $I_{PTAT}$ 90 may include twice the value of a summation of I1 and I2. A portion of the $I_{PTAT}$ 92 may be mirrored (e.g., emulated) to an output PMOS branch 94, such that the PMOS branch 94 generates the $I_{PTAT}$ 90 with half the magnitude of the $I_{PTAT}$ 92. The $I_{PTAT}$ 90 may be transmitted to the reference current generation circuitry 50 and may be used by the reference current generation circuitry 50 to generate the reference current. Because the $V_{AnlgRef}$ and the $I_{PTAT}$ 90 may be generated via the bandgap circuit 40 that is generally present on each die of the semiconductor device 10, generation of these signals (e.g., $V_{AnlgRef}$ and the $I_{PTAT}$ 90) for use by the reference current generation circuitry 50 may occur without a significant increase in area and power consumption.

Figure 3:
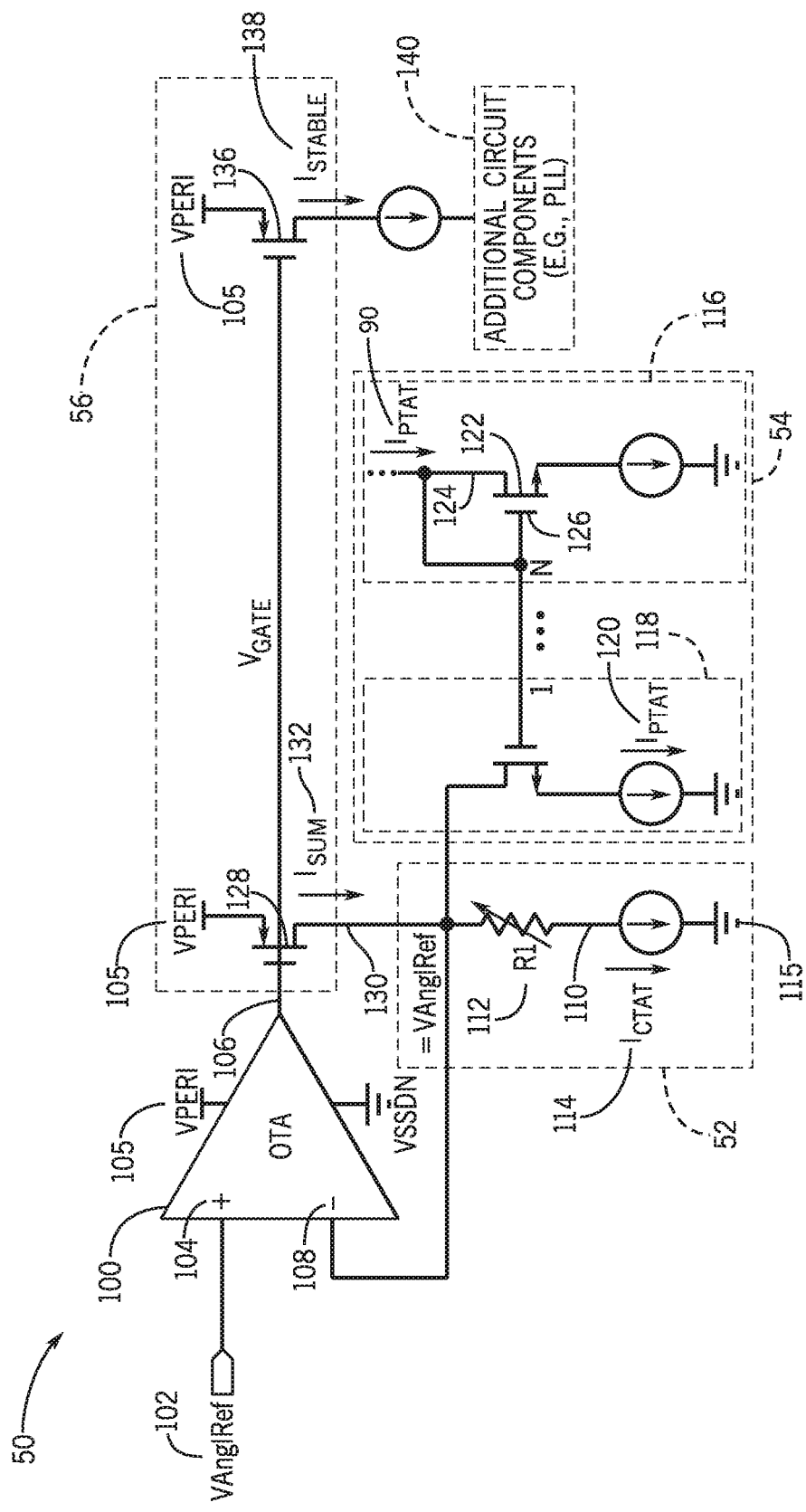
FIG. 3 is a schematic diagram of the reference current generation circuitry included in the semiconductor device of FIG. 1, in accordance with an embodiment of the present disclosure.

In some embodiments, the reference current generation circuitry 50 may use the $V_{AnlgRef}$ and the $I_{PTAT}$ 90 to generate CTAT and PTAT voltages/current with complimentary behaviors that in turn may be used to generate the reference current independent of variations in PVT conditions. FIG. 3 illustrates a schematic diagram of the reference current generation circuitry 50, including the $I_{CTAT}$ generation portion 52, the $I_{PTAT}$ tuning portion 54, and the variation-independent current generation portion 56 that may each utilize the $V_{AnlgRef}$ and/or the $I_{PTAT}$ current to generate the reference current, in accordance with an embodiment of the present disclosure.

As shown, the $I_{CTAT}$ generation portion 52 may be coupled to a voltage follower amplifier 100 that receives an input voltage (e.g., $V_{AnlgRef}$) 102 from the trimming circuitry 42 at its positive terminal 104. As previously mentioned, the $V_{AnlgRef}$ 102 is a PVT-independent voltage that is extremely accurate. The voltage follower amplifier 100 may operate in a relatively low voltage domain as the voltage follower amplifier 100 may be driven using the power supply potential VPERI 105. Further, the voltage follower amplifier 100 may force an output 106 of the voltage follower amplifier 100 to be equivalent to the input 102 of the voltage follower amplifier 100. That is, the output 106 and a negative input terminal 108 of the voltage follower amplifier 100 are at a potential equivalent to $V_{AnlgRef}$. In some embodiments, the $V_{AnlgRef}$ may be 0.8 volts or another suitable voltage. The voltage follower amplifier 100 may act as a buffer between the bandgap circuit 40 and electrical loads (e.g., phase-locked loop (PLL)), thereby avoiding loading of the bandgap circuit 40.

The $I_{CTAT}$ generation portion 52 may include a resistor branch 110 that is coupled to the negative input terminal 108 and may include a resistor (e.g., R1) 112. Because the resistor branch 110 is coupled between the negative input terminal 108 and ground 115, the voltage drop across the resistor 112 may be equivalent to $V_{AnlgRef}$. Using ohm's law, the current flowing through the resistor 112 may be $V_{AnlgRef}$/R1. This current may be a CTAT current ($I_{CTAT}$ 114) that varies inversely with temperature changes. In particular, as the temperature increases, the resistance of the resistor 112 may increase, and thus, the magnitude of the $I_{CTAT}$ 114 may decrease. As such, the $I_{CTAT}$ generation portion 52 may generate the $I_{CTAT}$ 114 using the $V_{AnlgRef}$ and the bandgap voltage ($V_{bgr}$) 88 output by the bandgap circuit 40.

In some embodiments, the reference current generation circuitry 50 may also include the $I_{PTAT}$ tuning portion 54 that generates the $I_{PTAT}$, such that the $I_{PTAT}$ is complimentary in behavior to the $I_{CTAT}$ 114 with regard to temperature. In particular, the $I_{PTAT}$ tuning portion 54 may receive the $I_{PTAT}$ 90 from the bandgap circuit 40 at a first MOSFET branch 116. The first MOSFET branch 116 may be placed in a current mirror configuration with a second MOSFET branch 118 and thus, the $I_{PTAT}$ 90 may be mirrored to the second MOSFET branch 118 to generate an $I_{PTAT}$ 120 with a behavior complimentary to the $I_{CTAT}$ 114.

In some embodiments, the $I_{PTAT}$ tuning portion 54 may include additional MOSFET branches in a similar configuration as that of the first MOSFET branch 116 to adjust the magnitude of the $I_{PTAT}$ 90, such that the $I_{PTAT}$ 90 is complimentary to the $I_{CTAT}$ 114. For example, an N number of MOSFET branches may be coupled to the first MOSFET branch 116, for example, at a gate terminal 122 and a source terminal 124 of the MOSFET 126 by closing a switch between each of the additional MOSFET branches and the first MOSFET branch 116. Based on the ratio (e.g., 1:N) between the second MOSFET branch 118 and the N number of MOSFET branches, the $I_{PTAT}$ 120 that is mirrored to the second MOSFET branch 118 would be adjusted to a value $I_{PTAT}$ 90 divided by N. The number of additional MOSFET branches incorporated may be chosen based on how much the $I_{PTAT}$ 120 should be trimmed to be nearly or exactly complimentary to the behavior of the $I_{CTAT}$ 114 with regard to temperature.

Additionally or alternatively, the reference current generation circuitry 50 may include the variation-independent current generation portion 56 that generates the reference current. In particular, the variation-independent current generation portion 56 may include a MOSFET 128 that is coupled to the $I_{CTAT}$ generation portion 52 and the $I_{PTAT}$ tuning portion 54 at a drain terminal 130 of the MOSFET 128. Using Kirchhoff's Current Law, a current flowing at the drain terminal 130 must be equivalent to a sum of the current flowing in the $I_{CTAT}$ generation portion 52 and to the current flowing in the second MOSFET branch 118 of the $I_{PTAT}$ tuning portion 54. That is, the summation current (e.g., $I_{sum}$) 132 may be equivalent to the $I_{CTAT}$ 114 plus the $I_{PTAT}$ 120.

Since the $I_{CTAT}$ 114 and the $I_{PTAT}$ 120 are complementary in their dependency on temperature, the summation of the $I_{CTAT}$ 114 and the $I_{CTAT}$ 114 may cancel out temperature-induced fluctuations and thus, may result in the summation current 132 being independent of variations in temperature. FIG. 4 illustrate how the $I_{CTAT}$ 114 and the $I_{PTAT}$ 120 may be summed together to generate the summation current 132 that is independent of variations in the PVT conditions, in accordance with an embodiment of the present disclosure. The graph 150 depicts current behavior in circuit elements whose operational behavior depends on temperature variations. A line 152 may correspond to a magnitude of the $I_{PTAT}$ 120. As shown, the magnitude of the $I_{PTAT}$ 120 may increase (e.g., from 1 microamps (μA) to 5 μA) as the temperature increases (e.g., from −40° C. to 130° C.). Such current behavior may be seen across diodes and/or other elements composed of active material.

Further, a line 154 may correspond to a magnitude of the $I_{CTAT}$ 114, which may decrease (e.g., from 1 μA to 5 μA) as the temperature increases (e.g., from −40° C. to 130° C.). Such current behavior may be seen across resistors with resistances that increase as temperature increase. Regardless of the temperature value, when the $I_{PTAT}$ 120 and the $I_{CTAT}$ 114 are added together, the resulting sum (e.g., 6 μA) is summation current 132. As shown, the value of the summation current 132 does not fluctuate as the temperature varies. The stable behavior is a result of the complimentary nature of the $I_{PTAT}$ 202 and $I_{CTAT}$ 204. It should be appreciated that while the graph 150 depicts variations in current behavior and temperature over a certain range, such behavior of the $I_{PTAT}$ 120, the $I_{CTAT}$ 114, and the summation current 132 may occur over a variety of current magnitude and temperature ranges and thus, the graph 150 should not be interpreted as limiting the presently disclosed techniques to the depicted current magnitude and temperature ranges. Further, it should be appreciated that the magnitude of the summation current 132 may vary based on the current magnitude and temperature ranges used.

Turning back to FIG. 3, because the $I_{CTAT}$ 114 and the $I_{PTAT}$ 120 are generated independent of process variations, as the $I_{CTAT}$ 114 is based on the $V_{AnlgRef}$ and the $I_{PTAT}$ 120 on the $\Delta V_{be}$, both of which are independent of transistor processes, the resulting summation current 132 may also be independent of variations in process conditions. In addition, because the variation-independent current generation portion 56 may be driven using a consistent voltage source, the resulting summation current 132 may also be independent of variations in voltage conditions. For example, the MOSFET 128 may be driven using the power supply potential VPERI 134 and thus, because the $V_{AnlgRef}$ and the $\Delta V_{be}$ are also constant, the summation current 132 may be independent of variations in voltage conditions. As such, the summation current 132 is independent of variations in the PVT conditions.

The MOSFET 128 may be in a current mirror configuration with another MOSFET 136 by tying the respective gate terminals of the MOSFET 128 and the MOSFET 136 with each other and the respective source terminals of the MOSFET 128 and the MOSFET 136 to the same power supply potential VPERI 134. The current mirror configuration may enable the summation current 132 to be mirrored to the MOSFET 136 as a stable reference current (e.g., $I_{STABLE}$) 138 that is also be independent of variations in the PVT conditions. In some embodiments, the current mirror configuration may prevent loading the other portions of the reference current generation circuitry 50 by additional circuit elements 140 coupled to the variation-independent current generation portion 56. Indeed, a drain terminal of the MOSFET 136 may be coupled to additional circuit elements 140 of the semiconductor device 10, such as the phase-locked loop (PLL), which receive the reference current 138.

Further, because a relatively low voltage power supply, such as the power supply potential VPERI 105, may be used to drive the generation of the reference current 138, the reference current 138 may be of a low voltage domain (e.g., VPERI domain). This may be advantageous in reducing overall power consumption and for compatibility with the additional circuit elements 140. For example, when a relatively high voltage power supply is used (e.g., VPP), the MOSFET 136 may need to sink more reference current as more current is generated with a higher voltage supply. As another example, the additional circuit elements 140 may be driven using the power supply potential VPERI 134 and thus, when the reference current 138 is also driven using the power supply potential VPERI 134, the additional circuit elements 140 may be able to handle the reference current 138. Although discussions of the bandgap circuit 40 and the reference current generation circuitry 50 refer to use of a MOSFET, any suitable transistor (e.g., bipolar junction transistors (BJTs), other field-effect transistors (FETs), and the like) may be used in the bandgap circuit 40 and the reference current generation circuitry 50.

Embodiments of the present disclosure relate to generating a PVT-independent reference current for a relatively low voltage domain (e.g., VPERI domain) by reusing outputs of the bandgap circuit 40 and using a power supply potential of the low voltage domain to drive the reference current generation circuitry 50. By reusing outputs of the bandgap circuit 40, a single op-amp may be used to generate the $I_{CTAT}$ 114 and the $I_{PTAT}$ 120 within the reference current generation circuitry 50, and thus, a single op-amp may be used to generate the reference current 138. This may reduce current and area consumption. Further, using the reference voltage (e.g., $V_{AnlgRef}$) that is trimmed for each die may improve accuracy as trimming of the reference voltage may account for variations in the silicon fabrication after tape-out. Additionally, generating the reference current 138 as part of the low voltage domain may reduce power consumption and improve compatibility with the additional elements 140 of the semiconductor device 10.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An apparatus, comprising:
   a bandgap circuit configured to output a bandgap voltage and a first proportion-to-absolute temperature (PTAT) current;
   trimming circuitry configured to output a reference voltage based at least in part on the bandgap voltage, wherein the reference voltage is different than the bandgap voltage; and
   reference current generation circuitry comprising:

a complementary-to-absolute-temperature (CTAT) current generation portion configured to generate a CTAT current based on the reference voltage;
a PTAT current tuning portion configured to:
receive the first PTAT current from the bandgap circuit; and
tune the first PTAT current to generate a second PTAT current, wherein the second PTAT current is complimentary to the CTAT current; and
a variation-independent reference current generation portion configured to generate a reference current based at least in part on the CTAT current and the second PTAT current.

2. The apparatus of claim 1, wherein the trimming circuitry comprises a resistor stack configured to adjust the bandgap voltage to a voltage level of the reference voltage.

3. The apparatus of claim 1, wherein the reference voltage is 0.8 volts, and wherein the reference current is independent of variations in process, voltage, and temperature (PVT) conditions.

4. The apparatus of claim 1, comprising a voltage follower amplifier coupled to the CTAT current generation portion, the PTAT current tuning portion, and the variation-independent reference current generation portion.

5. The apparatus of claim 4, wherein the voltage follower amplifier is configured to:
receive the reference voltage from the trimming circuitry; and
output the reference voltage to the CTAT current generation portion.

6. The apparatus of claim 1, wherein the CTAT current generation portion comprises a CTAT resistor, and wherein the CTAT resistor is configured to generate the CTAT current based at least in part on a voltage drop across the CTAT resistor equivalent to the reference voltage.

7. The apparatus of claim 1, wherein the PTAT current tuning portion comprises a plurality of metal-oxide semiconductor field-effect transistor (MOSFET) branches configured to generate the second PTAT current.

8. The apparatus of claim 7, wherein a first portion of the plurality of MOSFET branches is configured to receive the first PTAT current from the bandgap circuit, and wherein the first portion of the plurality of MOSFET branches is configured to tune the first PTAT current to generate the second PTAT current by forming a current divider that divides a magnitude of the first PTAT current by a number of MOSFET branches of the first portion of the plurality of MOSFET branches.

9. The apparatus of claim 8, wherein a second portion of the plurality of MOSFET branches is coupled to the first portion of the plurality of MOSFET branches in a current mirror configuration.

10. The apparatus of claim 8, wherein a second portion of the plurality of MOSFET branches is configured to:
emulate the second PTAT current generated by the first portion of the plurality of MOSFET branches; and
transmit the second PTAT current to the variation-independent reference current generation portion.

11. The apparatus of claim 1, wherein the variation-independent reference current generation portion is coupled to a CTAT resistor of the CTAT current generation portion and to a metal-oxide semiconductor field-effect transistor (MOSFET) branch of the PTAT current tuning portion.

12. The apparatus of claim 1, wherein the variation-independent reference current generation portion comprises a MOSFET branch configured to generate the reference current by summing the CTAT current and the second PTAT current to reduce effects of PVT variations on a reference current output by the variation-independent reference current generation portion.

13. The apparatus of claim 12, wherein the variation-independent reference current generation comprises another MOSFET branch coupled to the MOSFET branch in a current mirror configuration.

14. The apparatus of claim 13, wherein the other MOSFET branch is configured to:
emulate the second PTAT current; and
transmit the second PTAT current to additional circuit components of the apparatus.

15. The apparatus of claim 1, wherein the reference current is of a peripheral voltage (VPERI) low voltage domain.

16. Circuitry for generating a reference current, comprising:
a complementary-to-absolute-temperature (CTAT) current generation portion comprising a CTAT resistor, wherein the CTAT resistor is configured to generate a CTAT current based on a reference voltage, wherein the reference voltage is based at least in part on a bandgap voltage received from a bandgap circuit, and wherein the reference voltage is different than the bandgap voltage; and
a proportion-to-absolute temperature (PTAT) current tuning portion comprising a plurality of metal-oxide semiconductor field-effect transistor (MOSFET) branches, wherein a first portion of the plurality of MOSFET branches is configured to tune a PTAT current from the bandgap circuit, and wherein a second portion of the plurality of MOSFET branches is configured to transmit a mirror PTAT current based at least in part on the PTAT current; and
a variation-independent reference current generation portion comprising a current mirror, wherein the current mirror is configured to generate a reference current based at least in part on the CTAT current and the mirror PTAT current.

17. The circuitry of claim 16, comprising an operational amplifier in a voltage follower configuration, wherein the operational amplifier is configured to apply the reference voltage across the CTAT resistor.

18. The circuitry of claim 16, wherein the first portion of the plurality of MOSFET branches comprises one or more MOSFET branches that may be optioned out using a dedicated switch based at least in part on a behavior of the CTAT current with regard to temperature.

19. The circuitry of claim 16, wherein the first portion of the plurality of MOSFET branches is configured to receive the PTAT current from the bandgap circuit, and wherein the first portion of the plurality of MOSFET branches is in a current mirror configuration with the second portion of the plurality of MOSFET branches.

20. Reference current generation circuitry, comprising:
a voltage follower amplifier configured to output a reference voltage received from a trimming circuit, wherein the trimming circuit is configured to output the reference voltage based at least in part on a bandgap voltage received from a bandgap circuit, wherein the reference voltage is different than the bandgap voltage;
a complementary-to-absolute-temperature (CTAT) resistor branch configured to generate a CTAT current based on the reference voltage, wherein the CTAT resistor branch comprises a CTAT resistor coupled to an input node of the voltage follower amplifier;

a proportion-to-absolute temperature (PTAT) current tuning portion configured to generate a PTAT current comprising complementary current behavior with regard to the CTAT current, wherein the PTAT current tuning portion comprises:
  a first metal-oxide semiconductor field-effect transistor (MOSFET) branch configured to receive a bandgap PTAT current generated by the bandgap circuit;
  a second MOSFET branch coupled to the first MOSFET branch, wherein the second MOSFET branch is configured to facilitate tuning of the bandgap PTAT current to a value of the PTAT current; and
  a third MOSFET branch coupled to the first MOSFET branch and the second MOSFET branch, wherein the third MOSFET branch is configured to emulate the PTAT current generated by tuning the bandgap PTAT current; and
a variation-independent reference current generation portion configured to generate a reference current based at least in part on the PTAT current and the CTAT current, wherein the variation-independent reference current generation comprises:
  a fourth MOSFET branch coupled to an output of the voltage follower amplifier, the CTAT resistor branch, and the third MOSFET branch, wherein the fourth MOSFET branch is configured to sum the PTAT current and the CTAT current to generate the reference current; and
  a fifth MOSFET branch coupled to the fourth MOSFET branch in a current mirror configuration, wherein the fifth MOSFET branch is configured to emulate the reference current.

21. The reference current generation circuitry of claim 20, wherein the fourth MOSFET branch is coupled to the fifth MOSFET branch in a current mirror configuration by:
  coupling a source terminal of a first MOSFET of the fourth MOSFET branch and a source terminal of a second MOSFET of the fifth MOSFET branch to a peripheral voltage (VPERI) voltage source; and
  coupling a gate terminal of the first MOSFET and a gate terminal of the second MOSFET to the output of the voltage follower amplifier.

\* \* \* \* \*